(12) United States Patent
Stavenga et al.

(10) Patent No.: US 8,902,404 B2
(45) Date of Patent: *Dec. 2, 2014

(54) LITHOGRAPHIC APPARATUS AND DEVICE MANUFACTURING METHOD

(75) Inventors: Marco Koert Stavenga, Eindhoven (NL); Martinus Cornelis Maria Verhagen, Valkenswaard (NL); Johannes Henricus Wilhelmus Jacobs, Eindhoven (NL); Hans Jansen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 691 days.

This patent is subject to a terminal disclaimer.

(21) Appl. No.: 13/198,379

(22) Filed: Aug. 4, 2011

(65) Prior Publication Data

US 2011/0292358 A1 Dec. 1, 2011

Related U.S. Application Data

(63) Continuation of application No. 11/062,763, filed on Feb. 22, 2005, now Pat. No. 8,018,573.

(51) Int. Cl.
*G03B 27/42* (2006.01)
*G03B 27/52* (2006.01)
*G03F 7/20* (2006.01)

(52) U.S. Cl.
CPC ............ *G03F 7/70341* (2013.01); *G03F 7/709* (2013.01)
USPC ................................................ 355/53; 355/30

(58) Field of Classification Search
CPC .............................. G03F 7/709; G03F 7/70341

USPC ........................................ 355/30, 53; 250/548
See application file for complete search history.

(56) References Cited

U.S. PATENT DOCUMENTS

| 3,573,975 | A | 4/1971 | Dhaka et al. | 117/212 |
|---|---|---|---|---|
| 3,648,587 | A | 3/1972 | Stevens | 95/44 |

(Continued)

FOREIGN PATENT DOCUMENTS

| DE | 206 607 | 2/1984 |
|---|---|---|
| DE | 221 563 | 4/1985 |

(Continued)

OTHER PUBLICATIONS

Japanese Office Action dated Jul. 23, 2013 in corresponding Japanese Patent Application No. 2012-083578.

(Continued)

*Primary Examiner* — Hung Henry Nguyen
(74) *Attorney, Agent, or Firm* — Pillsbury Winthrop Shaw Pittman LLP

(57) ABSTRACT

Various types of pressure regulating devices are disclosed to reduce a pressure gradient in a liquid supply system of a lithographic apparatus, the liquid supply system having a liquid confinement structure configured to at least partially confine a liquid between a projection system and a substrate table of the lithographic apparatus. A high pressure gradient may cause particulate contamination in the liquid supply system and/or liquid confinement structure. A pressure gradient can be reduced by, for example, the use of slow switching in one or more valves, a bleed flow around or through one or more valves, diversion of liquid to a drain rather than or in addition to switching a valve off, a pressure regulator or flow restrictor to prevent shock waves, and a buffer volume/damper to compensate for pressure fluctuation.

20 Claims, 4 Drawing Sheets

(56) References Cited

U.S. PATENT DOCUMENTS

| | | | |
|---|---|---|---|
| 4,072,188 A | 2/1978 | Wilson et al. | |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,480,910 A | 11/1984 | Takanashi et al. | 355/30 |
| 4,509,852 A | 4/1985 | Tabarelli et al. | 355/30 |
| 4,704,348 A | 11/1987 | Koizumi et al. | |
| 5,040,020 A | 8/1991 | Rauschenbach et al. | 355/53 |
| 5,121,256 A | 6/1992 | Corle et al. | 359/664 |
| 5,610,683 A * | 3/1997 | Takahashi | 355/53 |
| 5,825,043 A | 10/1998 | Suwa | 250/548 |
| 5,892,572 A | 4/1999 | Nishi | |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 7,321,419 B2 * | 1/2008 | Ebihara | 355/72 |
| 7,779,781 B2 | 8/2010 | Mertens et al. | |
| 8,018,573 B2 * | 9/2011 | Stavenga et al. | 355/53 |
| 2002/0020821 A1 | 2/2002 | Van Santen et al. | 250/492 |
| 2002/0163629 A1 | 11/2002 | Switkes et al. | 355/53 |
| 2003/0035087 A1 | 2/2003 | Murayama | |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0136494 A1 | 7/2004 | Lof et al. | 378/34 |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | 355/30 |
| 2004/0211920 A1 | 10/2004 | Maria Derksen et al. | 250/492.1 |
| 2004/0239954 A1 | 12/2004 | Bischoff | 356/635 |
| 2004/0257544 A1 | 12/2004 | Vogel et al. | |
| 2004/0263809 A1 | 12/2004 | Nakano | 355/30 |
| 2005/0007569 A1 | 1/2005 | Streefkerk et al. | 355/30 |
| 2005/0018155 A1 | 1/2005 | Cox et al. | 355/30 |
| 2005/0024609 A1 | 2/2005 | De Smit et al. | 355/18 |
| 2005/0030497 A1 | 2/2005 | Nakamura | 355/30 |
| 2005/0046813 A1 | 3/2005 | Streefkerk et al. | 355/30 |
| 2005/0046934 A1 | 3/2005 | Ho et al. | 359/380 |
| 2005/0048220 A1 | 3/2005 | Mertens et al. | |
| 2005/0052632 A1 | 3/2005 | Miyajima | 355/53 |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/53 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0233081 A1 | 10/2005 | Tokita | 427/256 |
| 2006/0038968 A1 | 2/2006 | Kemper et al. | |

FOREIGN PATENT DOCUMENTS

| | | |
|---|---|---|
| DE | 224 448 | 7/1985 |
| DE | 242 880 | 2/1987 |
| EP | 0023231 | 2/1981 |
| EP | 0418427 | 3/1991 |
| EP | 1039511 | 9/2000 |
| EP | 1 571 698 A1 | 9/2005 |
| EP | 1 635 382 | 3/2006 |
| FR | 2474708 | 7/1981 |
| JP | 58-202448 | 11/1983 |
| JP | 62-065326 | 3/1987 |
| JP | 62-121417 | 6/1987 |
| JP | 63-157419 | 6/1988 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-176727 | 7/1999 |
| JP | 2000-058436 | 2/2000 |
| JP | 2001-091849 | 4/2001 |
| JP | 2004-193252 | 7/2004 |
| JP | 2004-207711 | 7/2004 |
| JP | 2005-057278 | 3/2005 |
| JP | 2005-236121 | 9/2005 |
| JP | 2006-222165 | 8/2006 |
| WO | WO 99/49504 | 9/1999 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/090577 | 10/2004 |
| WO | WO 2004/090633 | 10/2004 |
| WO | WO 2004/090634 | 10/2004 |
| WO | WO 2004/092830 | 10/2004 |
| WO | WO 2004/092833 | 10/2004 |
| WO | WO 2004/093130 | 10/2004 |
| WO | WO 2004/093159 | 10/2004 |
| WO | WO 2004/093160 | 10/2004 |
| WO | WO 2004/095135 | 11/2004 |
| WO | WO 2004/114380 | 12/2004 |
| WO | WO 2005/010611 | 2/2005 |
| WO | WO 2005/024517 | 3/2005 |
| WO | WO 2005/067013 | 7/2005 |

OTHER PUBLICATIONS

Japanese Office Action dated Jan. 10, 2012 in corresponding Japanese Patent Application No. 2009-169087.
M. Switkes et al., "Immersion Lithography at 157 nm", MIT Lincoln Lab, Orlando Jan. 2001, Dec. 17, 2001.
M. Switkes et al., "Immersion Lithography at 157 nm", J. Vac. Sci. Technol. B., vol. 19, No. 6, Nov./Dec. 2001, pp. 2353-2356.
M. Switkes et al., "Immersion Lithography: Optics for the 50 nm Node", 157 Anvers-1, Sep. 4, 2002.
B.J. Lin, "Drivers, Prospects and Challenges for Immersion Lithography", TSMC, Inc., Sep. 2002.
B.J. Lin, "Proximity Printing Through Liquid", IBM Technical Disclosure Bulletin, vol. 20, No. 11B, Apr. 1978, p. 4997.
B.J. Lin, "The Paths to Subhalf-Micrometer Optical Lithography", SPIE vol. 922, Optical/Laser Microlithography (1988), pp. 256-269.
G.W.W. Stevens, "Reduction of Waste Resulting from Mask Defects", Solid State Technology, Aug. 1978, vol. 21 008, pp. 68-72.
S. Owa et al., "Immersion Lithography; its potential performance and issues", SPIE Microlithography 2003, 5040-186, Feb. 27, 2003.
S. Owa et al., "Advantage and Feasibility of Immersion Lithography", Proc. SPIE 5040 (2003).
Nikon Precision Europe GmbH, "Investor Relations—Nikon's Real Solutions", May 15, 2003.
H. Kawata et al., "Optical Projection Lithography using Lenses with Numerical Apertures Greater than Unity", Microelectronic Engineering 9 (1989), pp. 31-36.
J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.
B.W. Smith et al., "Immersion Optical Lithography at 193nm", Future FAB International, vol. 15, Jul. 11, 2003.

(56) References Cited

OTHER PUBLICATIONS

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, *J. Microlith., Microfab., Microsyst.* 1(1):7-12 (2002).

European Search Report of EP Application No. 06250757.9, dated Oct. 5, 2006.

Singapore Written Opinion issued for Singapore Patent Application No. 200600429-5, dated Jul. 10, 2007.

Chinese Office Action dated Feb. 27, 2009 in corresponding Chinese Patent Application No. 200610004195.2.

An English language translation of Ebihara (WO 2004/114380), Jun. 2008.

Tom Henderson, Lesson 3: Newton's Second Law of Motion, 1996-2004, http://www.glenbrook.k12.il.us/GBSSCI/PHYS/CLASS/newtlaws/u213a.html.

Ron Kurtus, Pressure in Fluids, 2005, http://www.school-for-champions.com/science/fluidpressure.htm.

* cited by examiner

LITHOGRAPHIC APPARATUS AND DEVICE MANUFACTURING METHOD

This application is a continuation of U.S. patent application Ser. No. 11/062,763, filed on Feb. 22, 2005 now U.S. Pat. No. 8,018,573, now allowed, which is hereby incorporated in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA of the system and also increasing the depth of focus.) Other immersion liquids have been proposed, including water with solid particles (e.g. quartz) suspended therein.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application publication WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

SUMMARY

Liquid which is introduced into a liquid supply system, particularly to a liquid confinement structure such as comprising the one or more inlets, one or more outlets, and associated structure illustrated in FIGS. 2-4 and as illustrated in FIG. 5 (and discussed in more detail below), should be carefully controlled so that the pressure is such that turbulence, etc., does not cause an undesirable effect during an exposure. The vacuum and/or gas flow should be carefully controlled for the same reasons.

In order to control the liquid, gas and vacuum flows, valves are normally used. Tubing connected to these valves may experience high pressure gradients because of the rapid switching of the valves from closed to open and vice versa. Where there is low pressure, there is the risk of settling of bacteria and other particles. Where there is a change from low to high pressure, there is an increased risk of erosion of the surfaces of the tubing, which may cause particle contamination of the liquid supply system and thereby of the liquid confinement structure. Particle and/or bacterial contamination may seriously affect the consistency of a projection onto a substrate. Cleaning the system to remove particles is time consuming because of the required down time. It may take at least 20 minutes to clear deposited particles. Furthermore, particles that are deposited on a substrate may lead to defective printing of the substrate.

Accordingly, it would be advantageous, for example, to reduce pressure gradients so that pressure is neither reduced too much nor increased too quickly, in order to reduce particulate contamination of the liquid supply system.

According to an aspect of the invention, there is provided a lithographic apparatus, comprising:
a substrate table constructed to hold a substrate;
a projection system configured to project a radiation beam onto a target portion of the substrate;
a liquid supply system comprising a liquid confinement structure configured to at least partially confine a liquid between the projection system and the substrate table, and comprising a pressure regulating device configured to reduce a pressure fluctuation in liquid being supplied to the liquid confinement structure.

According to an aspect of the invention, there is provided a device manufacturing method, comprising:
projecting a patterned beam of radiation onto a substrate via a liquid confinement structure, the liquid confinement structure being supplied with a liquid via a liquid supply system; and
reducing a pressure fluctuation in the liquid in the liquid supply system.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
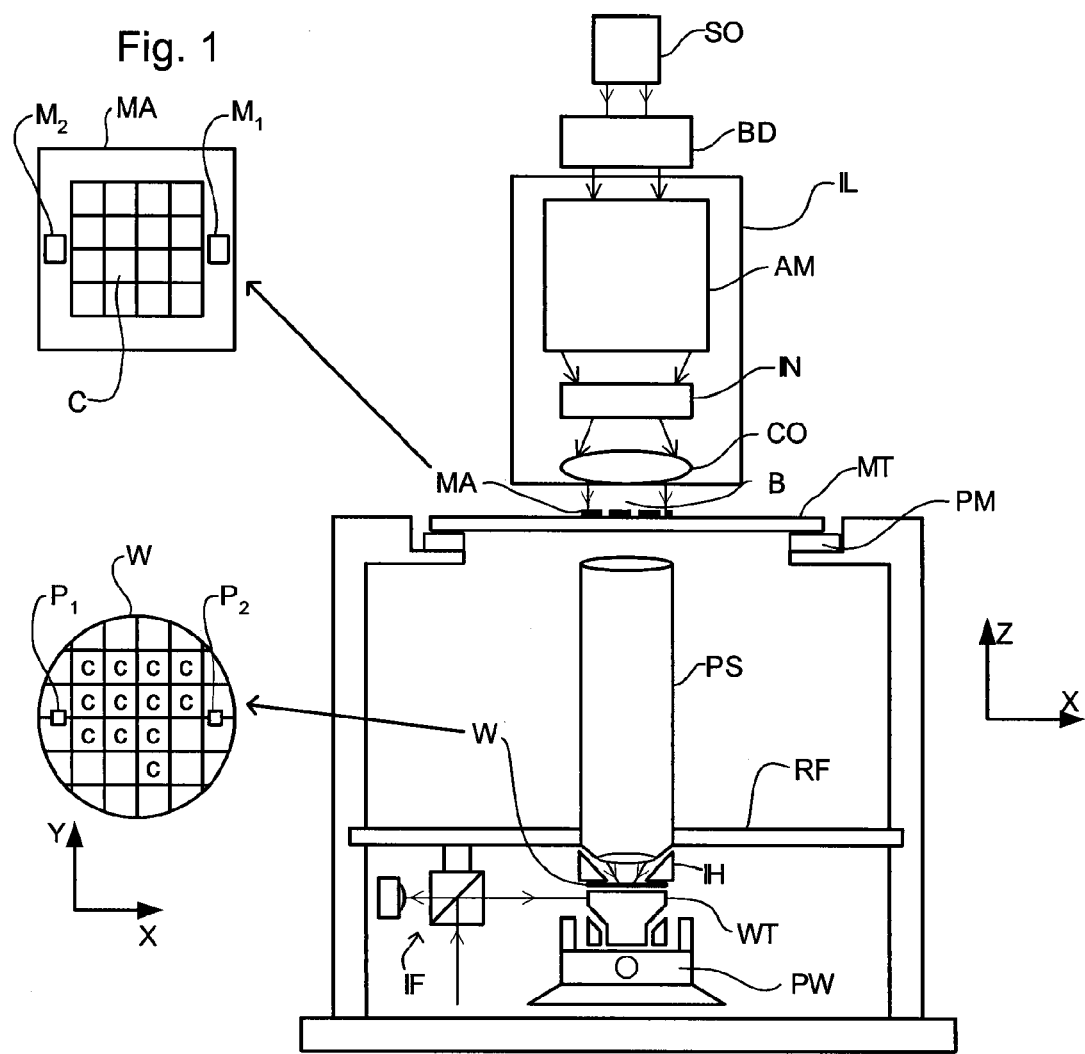
FIG. 1 depicts a lithographic apparatus according to an embodiment of the invention.
Figure 2:
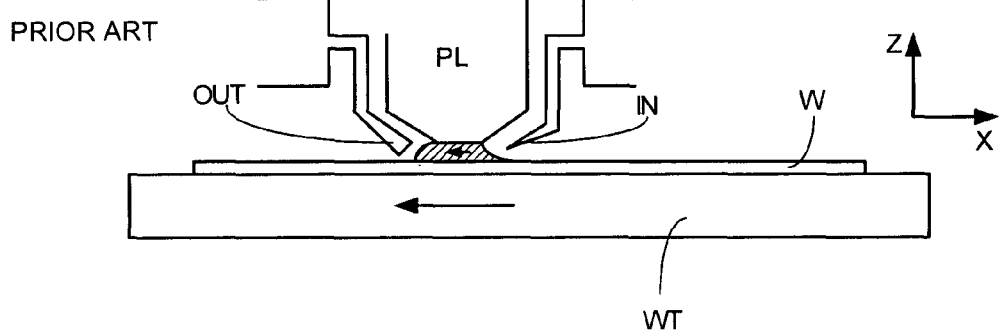
FIGS. 2 and 3 depict a liquid supply system for use in a lithographic projection apparatus.
Figure 3:
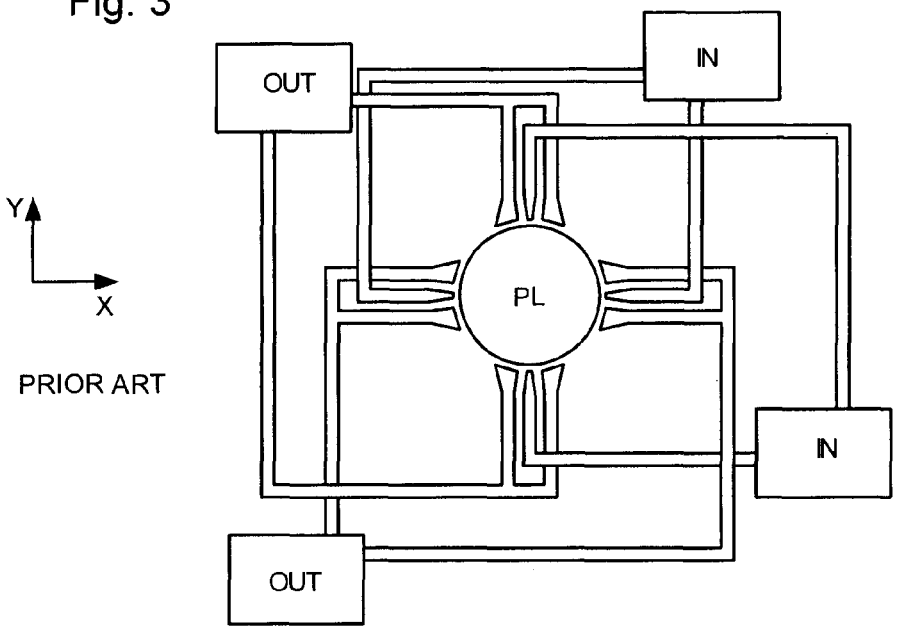

FIG. 1 schematically depicts a lithographic apparatus according to one embodiment of the invention. The apparatus comprises:

an illumination system (illuminator) IL configured to condition a radiation beam B (e.g. UV radiation or DUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
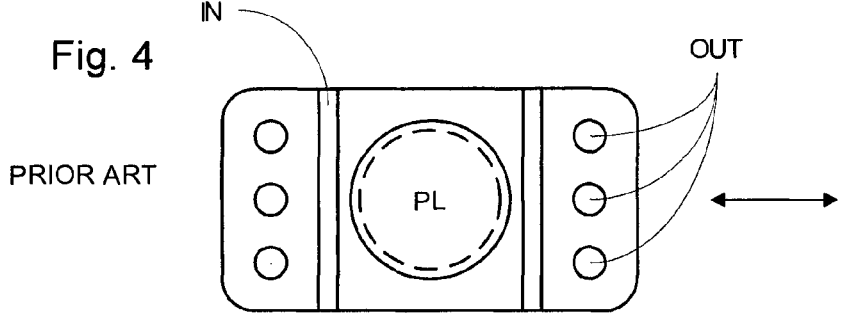
FIG. 4 depicts another liquid supply system for use in a lithographic projection apparatus.
Figure 4:
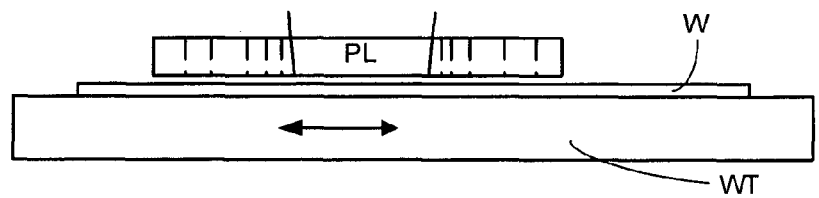

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
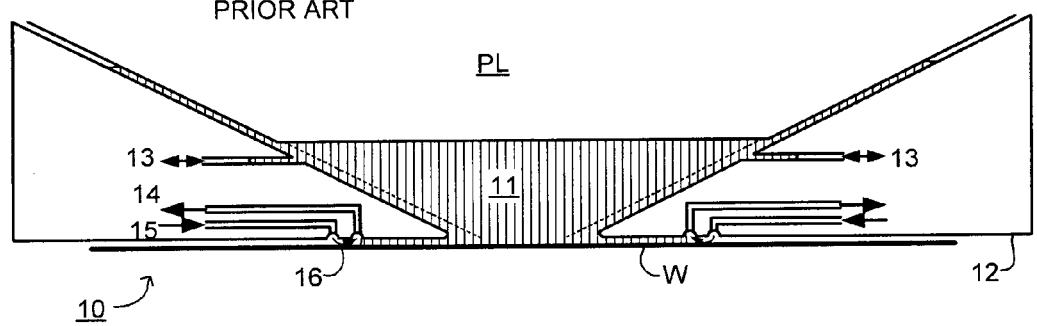
FIG. 5 depicts a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). See, for example, U.S. patent application Ser. No. 10/844,575, hereby incorporated in its entirety by reference. A seal is typically formed between the liquid confinement structure and the surface of the substrate. In an embodiment, the seal is a contactless seal such as a gas seal.

Referring to FIG. 5, reservoir 10 forms a contactless seal to the substrate around the image field of the projection system so that liquid is confined to fill a space between the substrate surface and the final element of the projection system. The reservoir is formed by a liquid confinement structure 12 positioned below and surrounding the final element of the projection system PL. Liquid is brought into the space below the projection system and within the liquid confinement structure 12. The liquid confinement structure 12 extends a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is confined in the reservoir by a gas seal 16 between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via first outlet 14. The overpressure on the gas inlet 15, vacuum level on the first outlet 14 and geometry of the gap are arranged so that there is a high-velocity gas flow inwards that confines the liquid.

The liquid supply system comprises an inlet for the liquid to enter the system and a "circulatory" system of conduits and valves to move and control flow of the liquid within the system. When liquid is required in the liquid confinement structure, the valves are switched to a first orientation. When liquid is not required, the valves are switched to a second orientation to stop or divert the liquid flow from the liquid confinement structure. The same applies to the gas and vacuum flows of outlet 14 and inlet 15 as shown in FIG. 5 and any the embodiments herein discussed with respect to liquid may be, as appropriately configured, applied to gas and vacuum flows. Further orientations of valve positions may be provided to increase or decrease the pressure of the liquid/gas/vacuum in the liquid confinement structure.

When switching a valve, the potential problems discussed above may become apparent. Particulate contamination in the liquid supply system or the liquid confinement structure may occur and possibly affect the exposure of the substrate. Clearly, the liquid (or gas or vacuum) should be pure and free from unacceptable levels of contamination. High pressure gradients (or rapid pressure changes) may be a source of this undesirable contamination.

As further discussed, there are several ways in which pressure gradients may be reduced in order to reduce particulate contamination of the liquid supply system and/or the liquid confinement structure.

A first method is to slow down the switching speed of one or more of the valves in the liquid supply system. For example, switching from 0 to about 2 or more liters per minute in 1 or 2 seconds can reduce particulate contamination to acceptable levels. Switching from 0 to about 2 or more liters per minute in 5 seconds can significantly or completely eliminate particulate contamination. Instead, switching from 0 to about 2 or more liters per minute in 0.1 second may lead to unacceptable levels of particulate contamination. In that case, the liquid supply system and/or liquid confinement structure will likely need to be cleaned to prevent defective exposure of the substrate. The slower switching of a valve may be especially important when the valve is downstream of a particle filter.

Furthermore, all valves in the liquid supply system can be switched at substantially the same speed to facilitate that liquid passing through all the valves is released or inhibited or diverted at the substantially same rate throughout the liquid supply system. The timing of the switching of a plurality of valves may also be carefully monitored in order that the liquid is not experiencing substantially different flow rates in different parts of the liquid supply system, the different flow rates being a potential cause of pressure gradients in the liquid supply system conduits. The switching of valves at the substantially same speed may be especially important to the valves downstream of a particle filter so that no new particles dislodged, etc. after the filter.

Another way of reducing a pressure gradient is to drain off liquid from the liquid supply system when it is not required in the liquid confinement structure, rather than switching the liquid supply system off. Switching the liquid supply system off means that the flow rate is very low, which may increase the risk of bacterial and particulate deposits. One way to achieve this draining is to have a valve that switches between allowing liquid to the liquid confinement structure and allowing liquid into a drain. It is possible to have the valve in the drain so that the valve opens the drain, rather than the valve switching between the liquid confinement structure and the drain. In that case, the liquid flowing in the conduit toward the liquid confinement structure diverts to the drain at a slower rate than if a valve were simply to switch between the liquid confinement structure and the drain because the liquid may continue to flow towards the liquid confinement structure until the drain is fully open. An alternative is to have a bleed flow which bypasses the valve and to keep a closed valve. Another alternative is to have a bleed flow through the valve itself. A further alternative is to have a bleed flow bypassing a valve and flowing into a drain. The purpose of a bleed flow is not to allow pressure of the fluid to build up behind a valve, for instance.

Figure 6A:
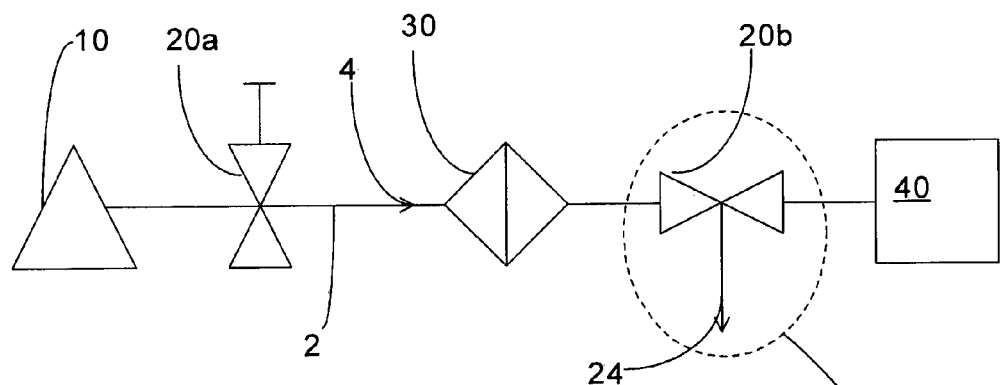
FIG. 6a depicts a liquid supply system according to an embodiment of the present invention.
Figure 6B:
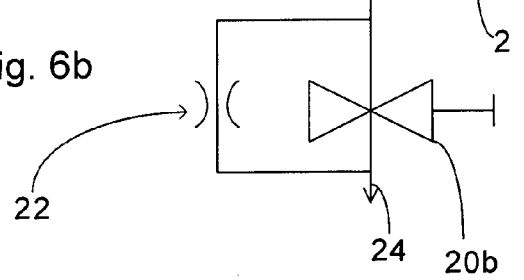
FIG. 6b depicts a part of a liquid supply system according to an embodiment of the present invention.

Examples of the positions of valves are shown in FIG. 6a. FIG. 6a shows two valves 20, one of which, 20a, may simply be switched slowly and the other of which, 20b, also comprises a drain 24. FIG. 6b shows an alternative to the valve 20b comprising the drain 24. FIG. 6b shows a bleed flow 22, which bypasses valve 20b and empties into drain 24. Arrow 2 shows the direction of flow of the liquid to the liquid confinement structure 40.

It can be seen that there may be valves 20 on either side of a particle filter 30. Liquid is supplied via an inlet 18, through valve 20a in direction 4 through the particle filter 30 and finally through valve 20b before reaching the liquid confinement structure 40. When the liquid confinement structure 40 does not require liquid, valve 20a may be slowly switched off and/or valve 20b may be switched to divert liquid down the drain 24. Alternatively, valve 20b may be switched to a closed position and liquid will flow into a drain 24 via a bleed flow 22 as shown in FIG. 6b.

Figure 7:
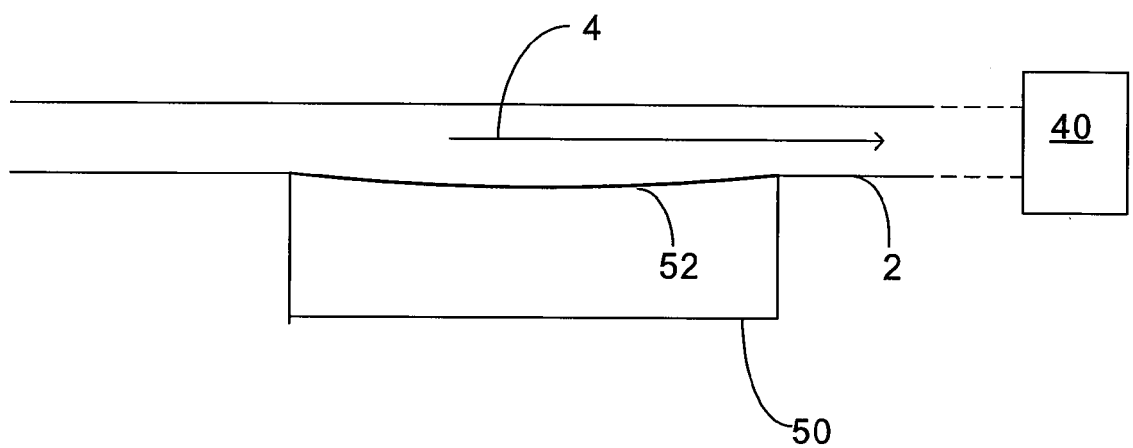
FIG. 7 depicts a further part of a liquid supply system according to an embodiment of the present invention.

FIG. 7 shows another embodiment to reduce a pressure gradient. In this case, a buffer volume/damper 50 contains liquid that keeps flow rates substantially constant by introducing liquid into the conduit 2 when the pressure of the flow 4 falls below a threshold.

Because of the static properties of buffer volume 50, there is a risk of bacterial or particle build up in the buffer volume 50 and so the buffer volume is kept physically separated from the rest of the liquid supply system by a flexible membrane 52. A buffer volume/damper 50 may also remove excess fluid if the pressure rises above a threshold. The baseline pressure in the buffer volume 50 is kept substantially the same as the desired pressure in the flow 4 in the liquid supply system. In this way, variations in pressure in the flow are compensated for. The larger the volume, the better the variation damping capability. The buffer volume may therefore be sized taking into account the desired flow and the expected pressure variations in the flow.

Although a buffer volume/damper may be useful for dampening pressure fluctuations, in an embodiment, it is desired to eliminate the fluctuations from the start, rather than compensate for them later. In order to do this, a further possibility is to introduce a pressure regulator 19 or flow restrictor 19 upstream of the liquid confinement structure and most of the liquid supply system, in the liquid supply system inlet 18. This may help reduce or prevent shock waves supplied by the liquid freshly introduced into the liquid supply system.

These solutions to the problem of pressure gradients may be used individually or in combination. The number and type used will depend on acceptable number of particles for the particular system in use as well as the types of conduits 2 used. Different conduits may be more or less prone to particulate erosion.

In an embodiment, the drain 24 is as close to the liquid confinement structure 40 as possible. This may make the benefits of the drain most efficient because the closer the drain is to the point where it is actually in use, the less piping is exposed to the flow variations as long as the combined flow to the liquid confinement structure and the flow to the drain is kept substantially constant. There is therefore less piping from which flow variations can erode contaminating particles.

In an embodiment, there is provided a lithographic apparatus, comprising: a substrate table constructed to hold a substrate; a projection system configured to project a radiation beam onto a target portion of the substrate; a liquid supply system comprising a liquid confinement structure configured to at least partially confine a liquid between the projection system and the substrate table, and comprising a pressure regulating device configured to reduce a pressure fluctuation in liquid being supplied to the liquid confinement structure.

In an embodiment, the device comprises a valve configured to change the flow rate of the liquid in the liquid supply system from 0 to about 2 or more liters/minute in 1 to 5 seconds. In an embodiment, the device comprising at least two valves, wherein all the valves are adapted to change the flow rate of the liquid in the liquid supply system at substantially the same speed. In an embodiment, the valve is positioned downstream of a particle filter in the liquid supply system. In an embodiment, the apparatus comprises at least two valves downstream of the particle filter, wherein all the valves are adapted to change the flow rate of the liquid in the liquid supply system at substantially the same speed. In an embodiment, the device comprises a drain and a valve in the liquid supply system, the valve configured to switch the flow of the liquid between the direction to the liquid confinement structure and the direction to the drain. In an embodiment, the valve is located within the drain. In an embodiment, the device comprises a bleed flow device for use with a valve in the liquid supply system, the bleed flow device configure to create a bleed flow of liquid in the liquid supply system even when the valve is switched to an off position. In an embodiment, the device comprises a pressure regulator in an inlet of the liquid supply system. In an embodiment, the device comprises a flow restrictor in an inlet of the liquid supply system. In an embodiment, the device comprises a buffer volume of liquid, the buffer volume configured to release liquid from the buffer volume when the volume of liquid in the liquid supply system drops below a threshold and configured to receive liquid into the buffer volume when the volume of liquid in the liquid supply system rises above a threshold. In an embodiment, the buffer volume is separated from the liquid supply system by a flexible membrane.

In an embodiment, there is provided a device manufacturing method, comprising: projecting a patterned beam of radiation onto a substrate via a liquid confinement structure, the liquid confinement structure being supplied with a liquid via a liquid supply system; and reducing a pressure fluctuation in the liquid in the liquid supply system.

In an embodiment, reducing the pressure fluctuation comprises switching liquid flow through a valve in the liquid supply system from 0 to about 2 or more liters/minute in 1 to 5 seconds. In an embodiment, reducing the pressure fluctuation comprises bleeding liquid around a valve in the liquid supply system so that the net flow of the liquid does not reduce to 0 liters/minute or to below 0.5 liters/minute. In an embodiment, reducing the pressure fluctuation comprises diverting the flow of liquid from towards the liquid confinement structure to a drain. In an embodiment, reducing the pressure fluctuation comprises adding liquid to the liquid supply system from a buffer volume if the pressure of liquid in the liquid supply system drops below a threshold. In an embodiment, reducing the pressure fluctuation comprises removing liquid from the liquid supply system to a buffer volume if the pressure of liquid in the liquid supply system rises above a threshold. In an embodiment, reducing the pressure fluctuation comprises regulating a pressure of the liquid at an inlet of the liquid supply system using a pressure regulator. In an embodiment, reducing the pressure fluctuation comprises preventing a shock wave from newly introduced liquid into the liquid supply system using a flow restrictor at an inlet of the liquid supply system.

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

What is claimed is:

1. A lithographic apparatus, comprising:
a substrate table constructed to hold a substrate;
a projection system configured to project a radiation beam onto a target portion of the substrate; and
a liquid supply system comprising a liquid confinement structure configured to at least partially confine a liquid in a space between the projection system and the substrate table; and
a pressure regulating device configured to reduce a pressure fluctuation in liquid being supplied in or to the liquid confinement structure, the pressure regulating device comprising a bleed flow device for use with a valve in the liquid supply system, the bleed flow device configured to create a bleed flow of liquid in the liquid supply system when the valve is switched to an off position.

2. The apparatus of claim 1, wherein the pressure regulating device further comprises a drain in the liquid supply system and the valve is configured to switch the flow of the liquid between a direction toward an inlet of the liquid confinement structure to the space and a direction to the drain.

3. The apparatus of claim 2, wherein the valve is located within the drain.

4. The apparatus of claim 1, wherein the pressure regulating device further comprises a pressure regulator upstream of the liquid confinement structure.

5. The apparatus of claim 1, wherein the pressure regulating device further comprises a flow restrictor upstream of the liquid confinement structure.

6. The apparatus of claim 1, wherein the pressure regulating device further comprises a drain in the liquid supply system and the bleed flow device is configured to create the bleed flow of liquid to the drain.

7. A lithographic apparatus, comprising:
a substrate table constructed to hold a substrate;
a projection system configured to project a radiation beam onto a target portion of the substrate;
a liquid supply system comprising a liquid confinement structure configured to at least partially confine a liquid between the projection system and the substrate table; and
a pressure regulating device configured to reduce a pressure fluctuation in liquid being supplied in or to the liquid confinement structure, the pressure regulating device comprising a buffer volume of liquid, the buffer volume configured to release liquid from the buffer volume when the volume of liquid in the liquid supply system drops below a threshold, or configured to receive liquid into the buffer volume when the volume of liquid in the liquid supply system rises above a threshold, or configured to both release and receive liquid.

8. The apparatus of claim 7, wherein a portion of the buffer volume is physically separated from the liquid in liquid supply system.

9. The apparatus of claim 8, wherein the portion is separated from the liquid in the liquid supply system by a flexible membrane.

10. The apparatus of claim 7, wherein the buffer volume is configured to release liquid from the buffer volume when the volume of liquid in the liquid supply system drops below the threshold.

11. The apparatus of claim 7, configured to maintain a pressure in the buffer volume to be substantially the same as the desired pressure of the liquid in the liquid supply system.

12. A device manufacturing method, comprising:
projecting a patterned beam of radiation onto a substrate via a space containing liquid, the liquid being supplied to the space via a liquid supply system; and
reducing a pressure fluctuation in the liquid in the liquid supply system using a pressure regulating device, the pressure regulating device comprising a bleed flow device for use with a valve in the liquid supply system, the bleed flow device creating a bleed flow of liquid in the liquid supply system when the valve is switched to an off position.

13. The method of claim 12, wherein reducing the pressure fluctuation comprises diverting the flow of liquid from towards the space to a drain.

14. The method of claim 13, wherein the valve is located within the drain.

15. The method of claim 12, wherein reducing the pressure fluctuation further comprises regulating a pressure of the liquid upstream of the space using a pressure regulator.

16. The method of claim 12, wherein reducing the pressure fluctuation comprises preventing a shock wave from newly introduced liquid into the liquid supply system using a flow restrictor at an inlet of the liquid supply system.

17. A device manufacturing method, comprising:
projecting a patterned beam of radiation onto a substrate via a liquid, the liquid being supplied via a liquid supply system; and
reducing a pressure fluctuation in the liquid in the liquid supply system, reducing the pressure fluctuation comprising adding liquid to the liquid supply system from a buffer volume if the pressure of liquid in the liquid supply system drops below a threshold, or removing liquid from the liquid supply system to a buffer volume if the pressure of liquid in the liquid supply system rises above a threshold, or both the adding and removing.

18. The method of claim 17, wherein a portion of the buffer volume is physically separated from the liquid in the liquid supply system.

19. The method of claim 18, wherein the portion is separated from the liquid in the liquid supply system by a flexible membrane.

20. The method of claim 17, comprising maintaining a pressure in the buffer volume to be substantially the same as the desired pressure of the liquid in the liquid supply system.

* * * * *